United States Patent [19]

Campbell et al.

[11] Patent Number: 5,359,319
[45] Date of Patent: Oct. 25, 1994

[54] ELECTROSTATIC DISCHARGE DETECTOR AND DISPLAY

[75] Inventors: Jeffrey D. Campbell, Hawthorne; Graham O. Gearing, Monrovia, both of Calif.

[73] Assignee: Minnesota Mining and Manufacturing Company, St. Paul, Minn.

[21] Appl. No.: 567,009

[22] Filed: Aug. 13, 1990

[51] Int. Cl.$^5$ .............................................. G08B 21/00
[52] U.S. Cl. ...................... 340/649; 340/650; 340/657; 340/635; 324/457
[58] Field of Search ............... 340/649, 650, 651, 652, 340/660, 635, ; 361/212, 220, 42; 324/457, 509

[56] References Cited

U.S. PATENT DOCUMENTS

| | | |
|---|---|---|
| 3,604,933 | 9/1971 | Cross et al. . |
| 3,627,408 | 12/1971 | Ferguson . |
| 3,745,412 | 7/1973 | Ruff ........................................ 361/220 |
| 3,868,172 | 2/1975 | Ii et al. . |
| 3,945,715 | 3/1976 | Drake . |
| 3,965,029 | 6/1976 | Arora . |
| 4,053,875 | 10/1977 | Kupersmit . |
| 4,106,107 | 8/1978 | Goodman . |
| 4,286,210 | 8/1981 | Ignatjev . |
| 4,307,726 | 12/1981 | Paulson et al. . |
| 4,465,969 | 8/1984 | Tada et al. . |
| 4,492,857 | 1/1985 | Averbuch et al. . |
| 4,507,605 | 3/1985 | Geisel . |
| 4,562,429 | 12/1985 | Conway et al. ............................ 340/657 |
| 4,580,188 | 4/1986 | Brown et al. ........................ 361/212 |
| 4,595,292 | 6/1988 | Amodeo et al. . |
| 4,649,374 | 3/1987 | Hoigaard ........................ 340/649 X |
| 4,671,161 | 6/1987 | Wu et al. . |
| 4,673,255 | 6/1987 | West et al. . |
| 4,688,900 | 8/1987 | Doane et al. . |
| 4,714,915 | 12/1987 | Hascal et al. ........................ 340/657 |
| 4,782,299 | 11/1980 | Argentieri . |
| 4,785,294 | 11/1988 | Campbell ........................ 340/649 |
| 4,792,667 | 12/1988 | Chen . |
| 4,825,152 | 4/1989 | Bossard . |
| 4,838,653 | 6/1989 | Mohebban . |
| 5,057,965 | 10/1991 | Wilson ........................ 340/652 X |

OTHER PUBLICATIONS

"Breakthrough in LCD Technology-Film May be Used to Determine Voltage", pp. 14–15 of *National Engineering*, Mar. 1987.

*Primary Examiner*—Jeffery A. Hofsass
*Attorney, Agent, or Firm*—Harris, Wallen, MacDermott & Tinsley

[57] ABSTRACT

A detector for detecting electrostatic discharge events in an electronic component, assembly or system and including a display element which produces an immediate indication on exposure to a change in voltage level, an electrostatic discharge sensor, and circuit means for connecting said sensor to said display element. In one embodiment, the detector and the board or other device to be monitored are mounted in a housing having a visual access window with the display element of the detector viewable through the access window and with the detector positioned at the electronic device being monitored.

11 Claims, 4 Drawing Sheets

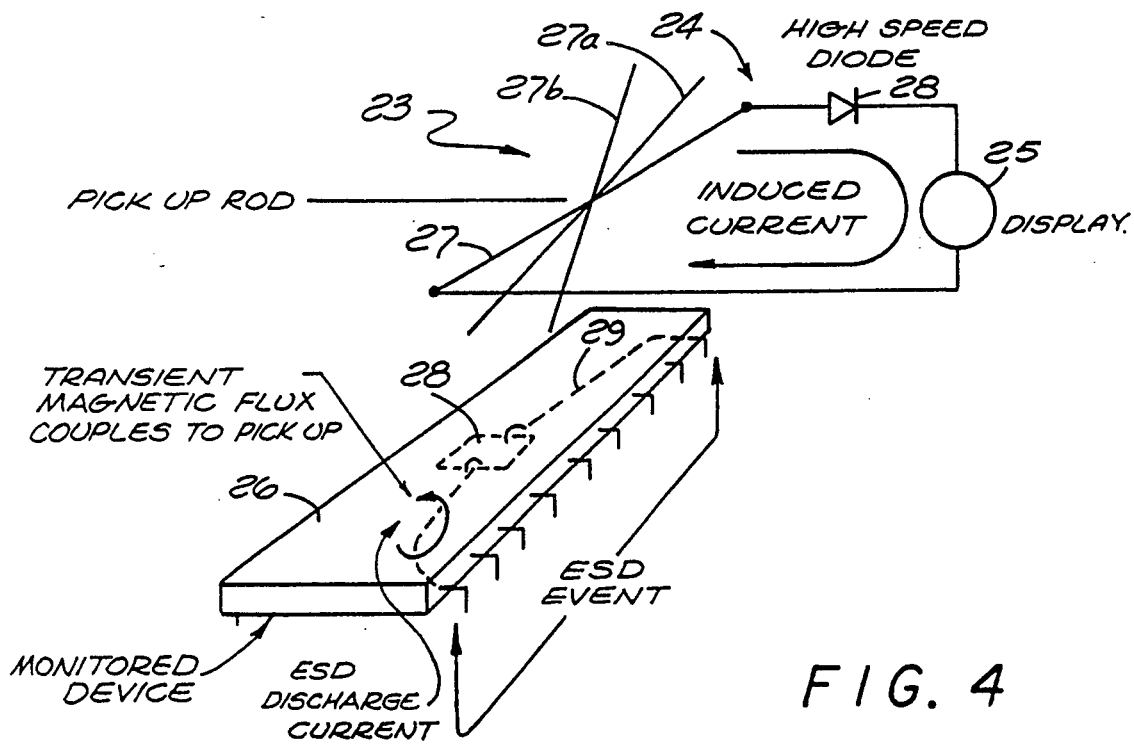
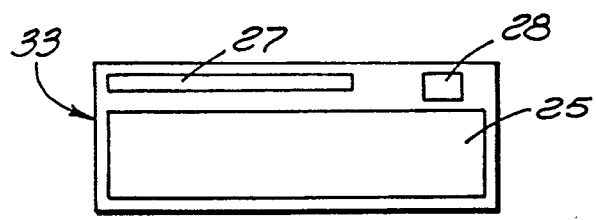
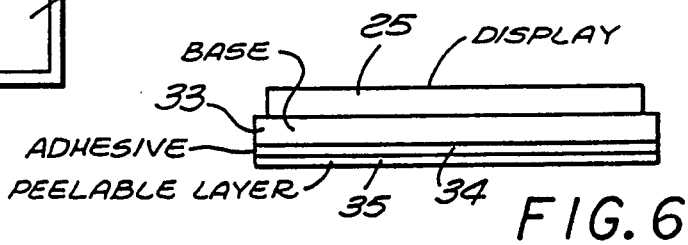
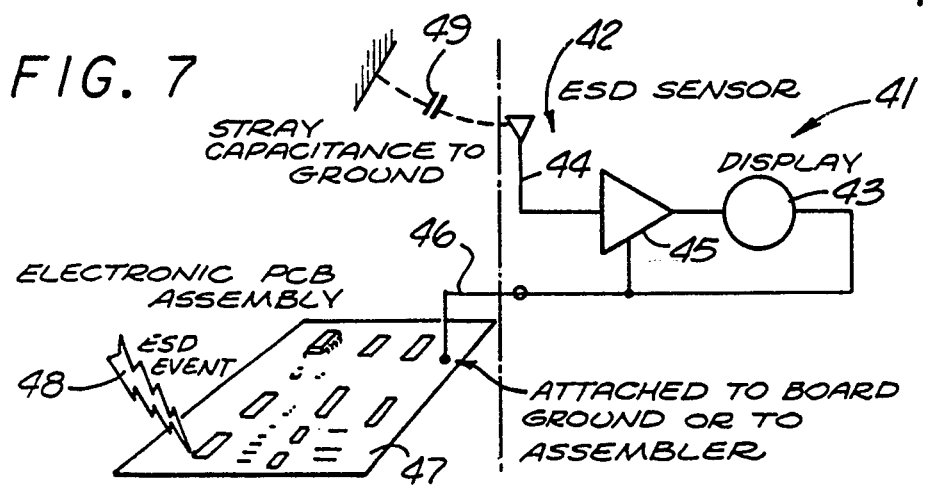

ELECTROSTATIC DISCHARGE DETECTOR AND DISPLAY

BACKGROUND OF THE INVENTION

This invention relates to new and improved detectors for detecting electrostatic discharge (ESD) events occuring in electronic components and electronic assemblies. The invention is particularly directed to detectors which can be positioned directly on or closely adjacent to the miniature electronic components and printed circuit board assemblies presently in use.

The electronics industry began to experience static problems in the 1960s, typically in the form of damage to components resulting from electrostatic discharges. In layman's language, mini lightning bolts occur within such electronic devices due to the build up and discharge of electrostatic potentials, with the lightning bolts or electrostatic discharges causing damage to components, which damage is not readily detected, even in testing of the components.

This problem has become more severe as technology advances have resulted in smaller and more dense semiconductors which are more suspectible to damage from such electrostatic discharge events. Electronic device susceptabilities are now routinely as low as 100 volts. Human beings can generally feel events no lower than 3500 volts.

A variety of instruments are currently manufactured for the purpose of measuring electrostatic fields in the area around an electronic assembly work space. Instruments of this type provide an alarm or a record of the measured electrostatic field level when a preset threshold is exceeded. Such instruments are described in U.S. Pat. No. 4,785,294 and the references of record in that patent.

Instruments of this nature are large compared to the electronic assemblies to be protected and are used in the work areas to monitor static field levels, but do not provide for an indication of the occurrence of an actual ESD event at a specific device or a PC board.

The present invention preferably utilizes a non-destructive direct reading display element. A non-destructive direct reading display element is one which can be read at any time to determine whether or not an ESD event has occurred, and if not, remains capable of indicating a subsequent ESD event. This is in contrast to an indirect reading display element which requires some type of change of condition in order to be read, which change prevents the element from subsequently indicating an ESD event. A photographic film is an example of an indirect reading display element, since the film must developed to determine whether not an ESD event has been detected. After developing, the film is mo longer useable to indicate an ESD event. A liquid crystal display is an example of a non-destructive direct reading display element. The liquid crystal display element can be read at any time without adversely affecting its capability of indicating a subsequent ESD event, if there has not beech a prior ESD event.

U.S. Pat. No. 4,838,653 discloses the use of an array of liquid crystal elements for the measurement of the build up of static electrical charge or electric field strength, i.e., for field monitoring. In order to achieve the desired sensitivity, the elements are connected in series. Earlier U.S. Pat. Nos. 4,286,210 and 3,627,408 disclose the use of a liquid crystal display element for an ion indicator or meter for detecting high voltage electric fields. These patents are not concerned with the detection and/or recording of actual ESD events.

Products in the ESD monitoring market focus on monitoring electric fields. While knowledge of the electric field level is helpful, experience with field level measurement has demonstrated that control of electric fields in manufacturing environments is nearly impossible, especially over large areas. The detectors detect non threatening fields from clothing, hair, etc. Also, problems are encountered at work benches and work areas where high voltage equipment is operated (CRT monitors, etc).

Field monitors alarm when threatening fields are present. They detect so many threats that tracking the source of each becomes an unbearable task. Some are real threats, some are not. The distinction is really the stored energy involved. This available energy is actually the destructive power behind an ESD source and is a product of the source capacitance and voltage. The stored energy is described by the equation $E=1/(2CV^2)$. No method exists for measurement of the sources capacitance without a direct connection. Therefore, prior to an event, one cannot measure the energy level of a potential ESD event. To further cloud this issue, insulators are less of a threat because they cannot quickly dump their charge to a device, i.e., they have no efficient discharge mechanism. Charge must move for a device to be damaged, and during an ESD event, it moves typically in nanoseconds. No method exists for the proximity measurement of discharge resistance.

Detection of ESD events overcomes these difficulties. An event monitor effectively "listens" for electric field transients generated during an ESD event. The distinction between ESD and other transients is their speed. The strength of an electrostatic discharge event is proportional to the level of the measured pulse. An event monitor is not false triggered by slowly changing fields in the area which causes field monitors to alarm.

The device of U.S. Pat. No. 4,838,653 relies on capacitive voltage division to measure the electric field. Consider a model of the equivalent circuit with two capacitors in series between the voltage source and ground. The voltage across each capacitor is inversely proportional to it's capacitance. The capacitor between the source and the internal node is the stray capacitance between the charged object and the plate of the display. The second capacitor models the display capacitance.

The continuous voltage source is divided by the capacitance ratio between the charged element and display square. The theoretical maximum sensitivity of passive LCD materials is $10^5$ volts/meter, far too low for use as an ESD sensor.

Another type of device is shown in U.S. Pat. Nos. 4,825,152. A piece of photographic film is positioned between two electrodes which serve as an antenna for picking up an ESD event and provide a spark gap. An event of sufficient strength will produce a spark at the gap, which spark is recorded in the photographic film. The film is later developed in the usual matter and visually inspected to determine if an ESD event has been detected and recorded. In order to visually determine the occurrence of an ESD event, this secondary film developing process must occur thereby preventing subsequent use of the film if no spark has occurred.

It is an object of the present invention to provide a new and improved detector for detecting very low voltage electrostatic discharge events at a specific electronic component or on an electronic assembly or PC board. Also, it is an object to provide such a detector which can directly mounted on the component or assembly to be monitored, and in addition, one which can be directly mounted on and connected to the body of a human assembler. This detector will provide an immediate visual indication of such an event and will not require developing.

It is a particular object of the present invention to provide such a detector which is small and inexpensive and therefore practical for use with the very large number of miniature electronic components and assemblies presently being produced. A further object of the invention is to provide such a detector which operates with a direct reading display element, preferably only a single liquid crystal display element. An additional object is to provide such a detector which can detect the low voltage ESD events without requiring amplification or a Dower source and provide an indication which is readily distinguished by the unaided human eye.

It is an object of the invention to provide such at detector incorporating a display element which changes indication on exposure to a change in voltage level, and an ESD sensor with circuitry for connecting the ESD sensor to the display element, and in the preferred embodiment, with a mounting arrangement for directly mounting the sensor and display onto the device to be monitored. A further object of the invention is to provide such a detector in which in one configuration, the display element and sensor are in a single component, and in another configuration, they are in separate components. An additional object is to provide such a detector which for some display elements, incorporates amplifier and/or latch circuitry.

These and other objects, advantages, features and results will more fully appear in the course of the following description.

SUMMARY OF THE INVENTION

A detector for detecting electrostatic discharge events in an electronic component, printed circuit board, or assembly device, including a non-destructive direct read inc display element which changes indication on exposure to a change in voltage level, an electrostatic discharge sensor and a circuit for connecting the sensor to the display element. In one embodiment, a detector including means for mounting the sensor and a direct reading display element directly on the device to be monitored, with a direct electrical connection or a magnetic coupling, preferably as a single component. In another embodiment, an antenna and an amplifier to increase power to drive the display portion of the detector which can be mounted near sensitive electronic components on a printed circuit board.

BRIEF DESCRIPTION OF THE DRAWINGS

FIG. 4 is a diagram illustrating one construction for the embodiment of FIG. 3;

FIG. 5 is a plan view of a detector and FIG. 6 is a side view of the detector of FIG. 5, illustrating one arrangement for direct mounting of the detector on a component;

FIG. 7 is an electrical diagram for another alternative embodiment of the detector which relies on capacitance coupling;

DESCRIPTION OF THE PREFERRED EMBODIMENTS

Figure 1:
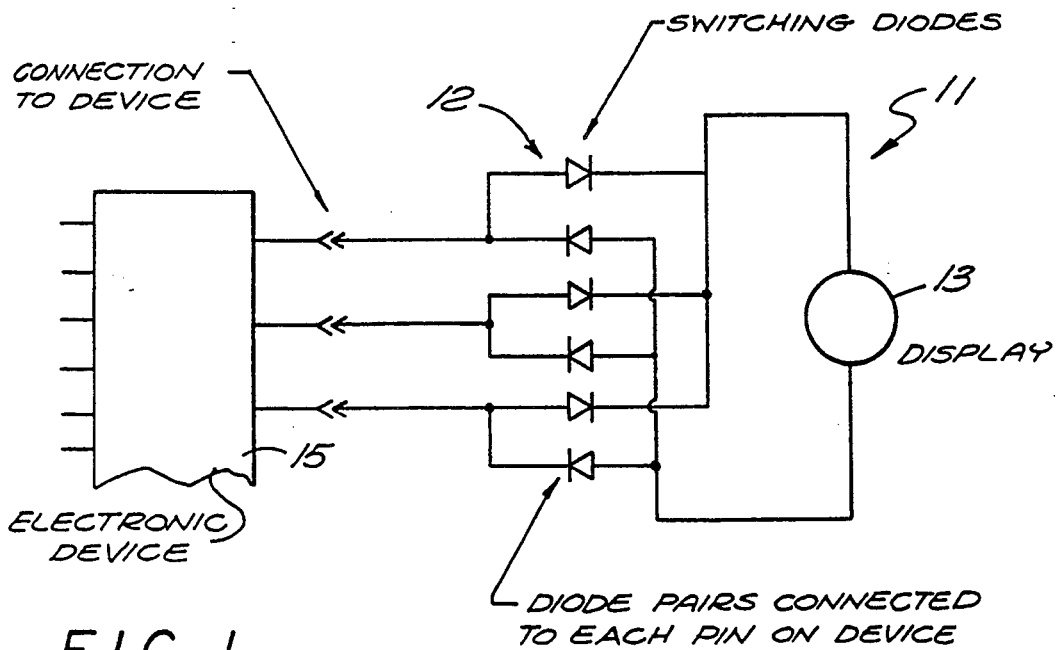
FIG. 1 is an electrical diagram of a detector for detecting an electrostatic discharge event and incorporating an embodiment of the invention.
Figure 2:
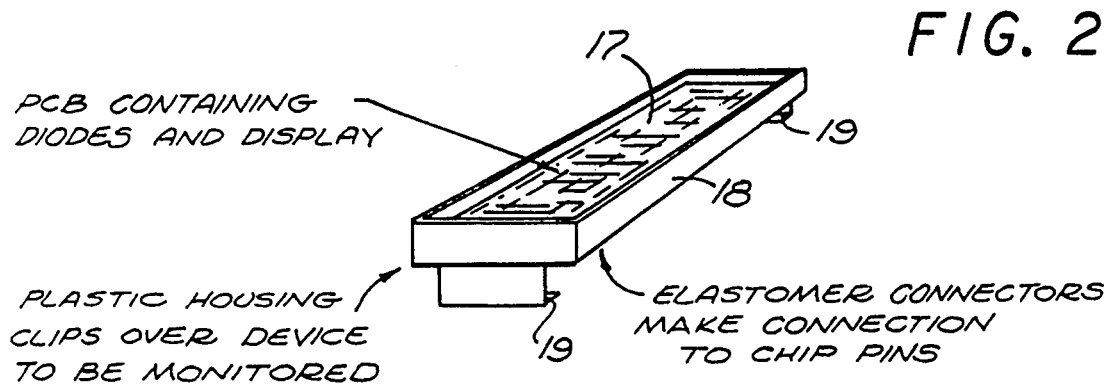
FIG. 2 is an illustration of one form of construction for the detector of FIG. 1.
Figure 3:
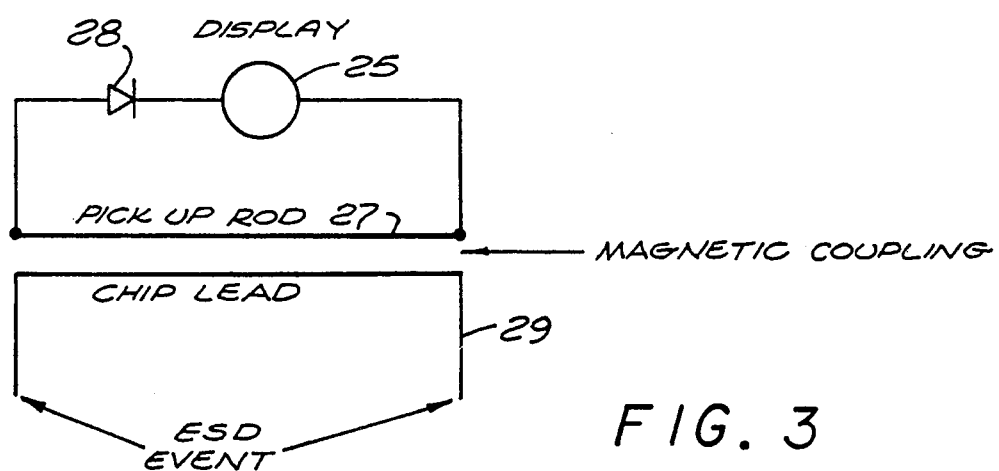
FIG. 3 is an electrical diagram of an alternative embodiment of the detector of the invention, which relies on detection of the change in transient magnetic fields that occurs when an ESD event takes place.

The exposure of an electronic device to an ESD event can be determined by a direct measurement and can be determined by a proximity measurement. A direct measurement may be made by wiring a detector to the connection pins of the component or assembly device to be monitored. The sensing of an over stress condition or an ESD event is used to produce a change in indication in a display element, typically an optical change in a bi-stable liquid crystal display. The change in indication may be a change in state or a change in color or a change in transmissivity or a change in other observable condition. A preferred embodiment of a direct measurement detector is shown in FIGS. 1 and 2. In the proximity measurement embodiment, a sensor detects ESD events by capturing the current generated by the event in an antenna adjacent to the element to be monitored. The signal from the antenna is amplified for driving a bi-stable display. A presently preferred embodiment of a proximity detector is shown in FIG. 3 and 4.

Sensors used in such applications should be fast and sensitive in order to capture the relatively short duration and low energy ESD events which are likely to damage the electronic components. Typically the energy associated with ESD events ranges from picojoules to microjoules and have a duration of nanoseconds to microseconds. This is the total energy dissipated by the ESD event and is not all available for the detector. Most of this energy is converted to heat during the event. For example, a 100 volt event produces 0.5 microjoules of energy. Usually only about 5 percent of this energy can be coupled into the detector.

Referring to FIGS. 1 and 2, a detector 11 comprising a sensor 12 and display element 13 is connected to the pins 14 of an electronic device 15. In this embodiment, the sensor utilizes a plurality of diodes 16 connected as a bridge rectifier to provide a unipolar voltage across the display. FIG. 2 shows the diodes and display mounted on a printed circuit board 17 carried in a housing 18 with attachment clips 19 for affixing the assembly to the electronic device 15. The electrical connections may be made by elastomer connections or spring clips or otherwise as desired. The elastomer connectors are conventional and are sometimes referred to as Zebra strips.

The sensor of the detector measures ESD exposure at the device level by measuring the difference in voltage levels between pins of the device. During an ESD event, the voltage across pins is three to four times the normal operating voltage. The bridge type sensor connected to all pins simulatenously monitors all pins for the greatest voltage difference. When a voltage threshold, determined by the characteristics of the display, is exceeded, the display changes state thereby providing an indication of exposure of the device to an ESD event which exceeds a predetermined level. In a simpler version, the diode bridge is not used and pins of the device are connected to the display by direct electrical connections, which serve as the sensor. In such an arrangement the detector may be considered a single component with the display element and connection also serving as the sensor.

A preferred form for the display 13 is a ferroelectric liquid crystal display which is bi-stable and which provides a visual indication of change of state, typically a change in color.

In this embodiment, an ESD event will produce a voltage between 15 and 25 volts for about 15 nanoseconds across the electronic device. The bridge rectifier of the sensor will convert this pulse to the polarity for driving the display. While the ESD event exists for only tens of nanoseconds, the voltage from the sensor to the display remains for several microseconds. This display pulse duration is a function of the circuit characteristics and can be selected, depending on the display resistance, the display capacitance, and the diode reverse recovery time.

Various types of liquid crystal displays which exhibit bi-stability may be used, including smectic A and chiral smectic C. A twisted nematic (TN) display also may be used. The low sensitivity and slow response time of the TN display are similar to that of the smectic A display; also the TN display has no memory. The chiral smectic C is a ferroelectric which exhibits greater sensitivity and speed than the other two, and permits detection of ESD events without a powered amplifier and latching circuitry. Reference may be made to the following US patents for additional information on such liquid crystal displays: U.S. Pat. Nos. 4,367,924; 4,563,059; 4,813,767; 4,813,771; and 4,840,463.

It should be noted that electronic component and assembly devices operate with a wide range of voltage levels, typically in the order of three to forty volts depending upon the device characteristics. This means that different detector sensitivities must be utilized for devices with different voltage levels. Also, since the devices, typically semiconductors, are packaged in many different package sizes, shapes and configurations, the arrangement for direct connection of the detector to the device must be designed for each type of device.

In FIGS. 3 and 4, a proximity type detector 23 includes a sensor 24 and display 25 positioned adjacent a device 26 to be monitored. The sensor includes an antenna or rod 27 and a detector 28 for providing the unipolar drive to the device. A component 28 and connecting leads 29 of the device 26 are shown in dotted lines.

The detector sensor functions with magnetically coupled energy induced during an ESD event adjacent to the device to be monitored. Normal transistent currents in a device during circuit operation do not exceed 0.5 amperes. However during an ESD event, the currents in the leads 29 in the device can easily exceed 5 amperes with low resistance discharge paths. Furthermore, currents in the device during an ESD event have rise times of about 2 nanoseconds which yield high di/dt factors and induce large voltages in nearby conductors. The detector uses a conductor as an antenna in the path of the changing magnetic field, which converts the rapidly changing field to a voltage which actuates the display. Currents in leads 29 will produce a substantial voltage in the antenna 27. The antenna for the proximity detector may include several of the rods 27, 27a, 27b at different orientations for improved omnidirectional sensing of ESD events. Where a plurality of antennae are used, a bridge rectifier like that of FIG. 1 is used.

An arrangement for mounting a detector, such as the proximity detector 23, on a device to be monitored is shown in FIGS. 5 and 6. The display 25, the antenna 27 and the diode 28 may be mounted on a base 33 and appropriately connected by leads or by a printed circuit on the base. A layer of adhesive 34 is applied to the opposite side of the base, with a peelable protective layer 35 over the adhesive. The detector is installed by removing the peelable protective layer and pressing the detector directly onto the device to be monitored.

Figure 10:
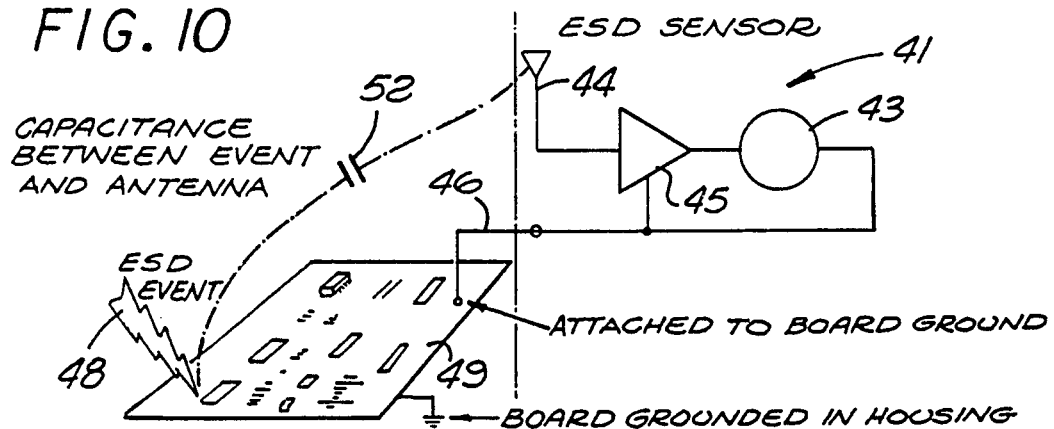
FIG. 10 is a diagram similar to that of FIG. 7 illustrating operation when the circuit board is directly grounded in the housing.

For applications where a detector cannot be positioned directly on or closely adjacent the device to be monitored, an amplifier may be desired because inadequate energy is available to transition the display following an ESD event. TN or smectic A displays do not have the sensitivity or response speed to be used in ESD event detectors without amplification. A detector of the type shown in FIGS. 3 and 4 suitable for positioning on or closely adjacent the device is sometimes referred to as a near proximity detector, while a detector which incorporates an amplifier is sometimes referred to as a far proximity detector. The near proximity detectors disclosed herein utilize the ferroelectric display element. Two configurations of far proximity detectors are shown in FIGS. 7 and 10, respectively. The detectors with an amplifier may use other displays, such as the TN and smectic A displays. The display element may be resettable in certain embodiments and not resettable in others. An amplifier can be used with any of the embodiments disclosed if desired.

The far proximity detector 41 of FIG. 7 includes a sensor 42 and display 43, with the sensor including an antenna 44 and an amplifier 45. The antenna is connected as an input to the amplifier, with the amplifier output connected to the display. The ground side of the circuit is connected to the device to be monitored, here circuit ground of a printed circuit board assembly 47, by a line 46. The stray capacitance between the antenna and ground is indicated at 49. In the embodiment shown in FIGS. 8 and 9, the line 46 is connected to the body of the assembler. The ESD event is shown diagrammetrically as a mini lightning bolt 48 at the board. The ESD event, a fast charge or discharge of the conductive mass of the board, is capacitively coupled to the: sensor at the antenna and ground. The sensor functions because more energy is coupled into either the ground or antenna inputs, producing a difference which is amplified at 45 to drive the display 43. In the connection arrangement of Fig. 7, an ESD event raises the ground potential of the sensor with respect to the antenna because the antenna has stray capacitance to earth ground. This type of detector is especially well-suited for use with printed circuit board assemblies because one sensor can monitor the entire assembly.

Figure 8:
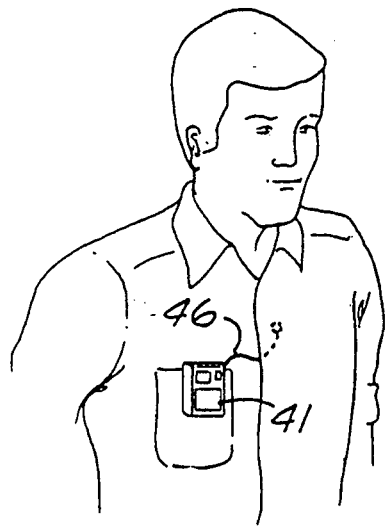
FIG. 8 is an illustration of the attachment of a detector to the body of an assembler.
Figure 9:
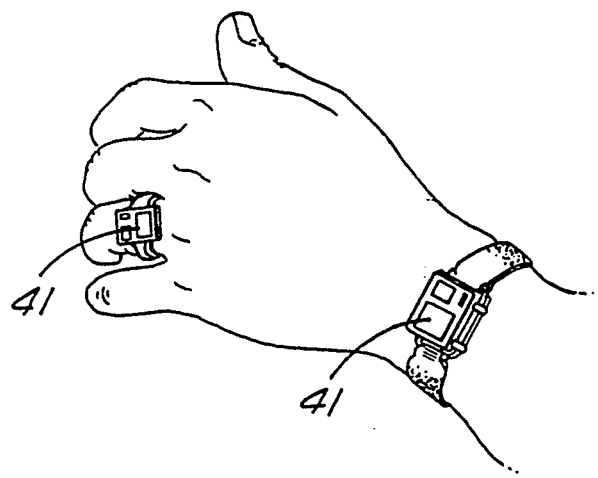
FIG. 9 is a view similar to that of FIG. 8 illustrating attachment to the wrist and to a finger of the assembler.

Other uses for the detector are shown in FIGS. 8 and 9, with the detector functioning as an electrostatic discharge indicator for use on electronic assembly personnel. The sensor ground line 46 is directly connected to the body of the assembler rather than to the electronic device to be monitored. FIG. 8 shows the detector clipped as a badge to a pocket, with the line 46 connected to the assembler. In FIG. 9, the detector 41 may be attached to the wrist in the same nature as a watch, or be attached to a conventional watch or watchband. Another alternative is shown in FIG. 9, with the detector mounted as a ring. In each instance, a metal electrode or conductor will provide a ground connection to the human body.

If the static charge of the assembler discharges, causing an ESD event, his or her entire body will experience a rapid discharge. This causes a difference of potential between the sensor ground and antenna resulting in a change of state at the display. The actual location of the sensor on the assembler body is not critical because the entire body discharges during such an event.

FIG. 10 shows an alternative mode of operation of the far proximity detector 41, where the board 49 is grounded within the housing. In this configuration, the capacitance coupling between the antenna and the ESD event at the board causes a difference of potential between the sensor ground 46 and antenna 44. The stray capacitance between the board and the antenna is indicated at 52.

Figure 11:
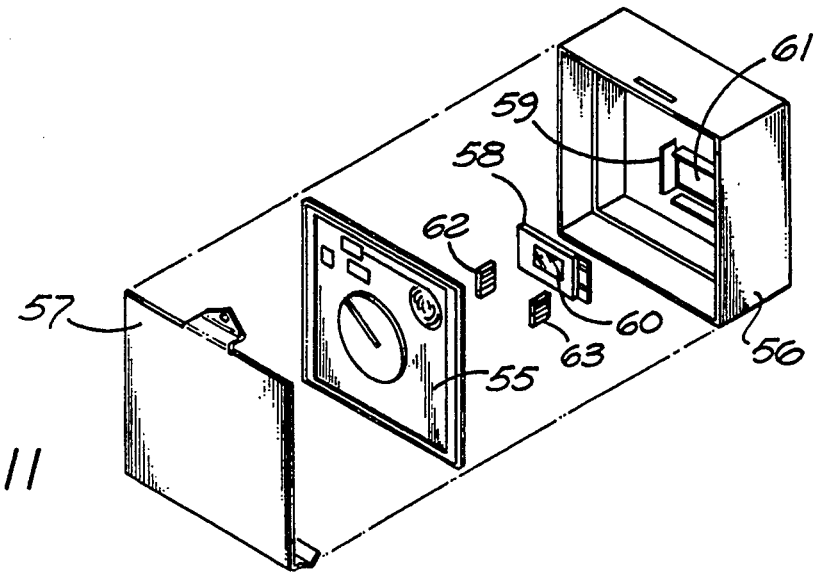
FIG. 11 is an exploded view of the presently preferred embodiment of the invention showing a detector and a printed circuit board in a housing.

A presently preferred form of package with the detector and an electronic device is shown in FIG. 11. A printed circuit board 55 is mounted in a housing 56 which is closed with a back plate 57. An ESD detector 58, such as that shown in FIG. 1, is positioned in a frame 59 in the housing, with the display element 60 of the detector positioned at window 61 in the housing. The detector is positioned adjacent the printed circuit board by an elastomer spacer 62 and an elastomer connector Zebra strip 63, the latter making direct electrical connection from the circuit board to the detector.

Figure 12:
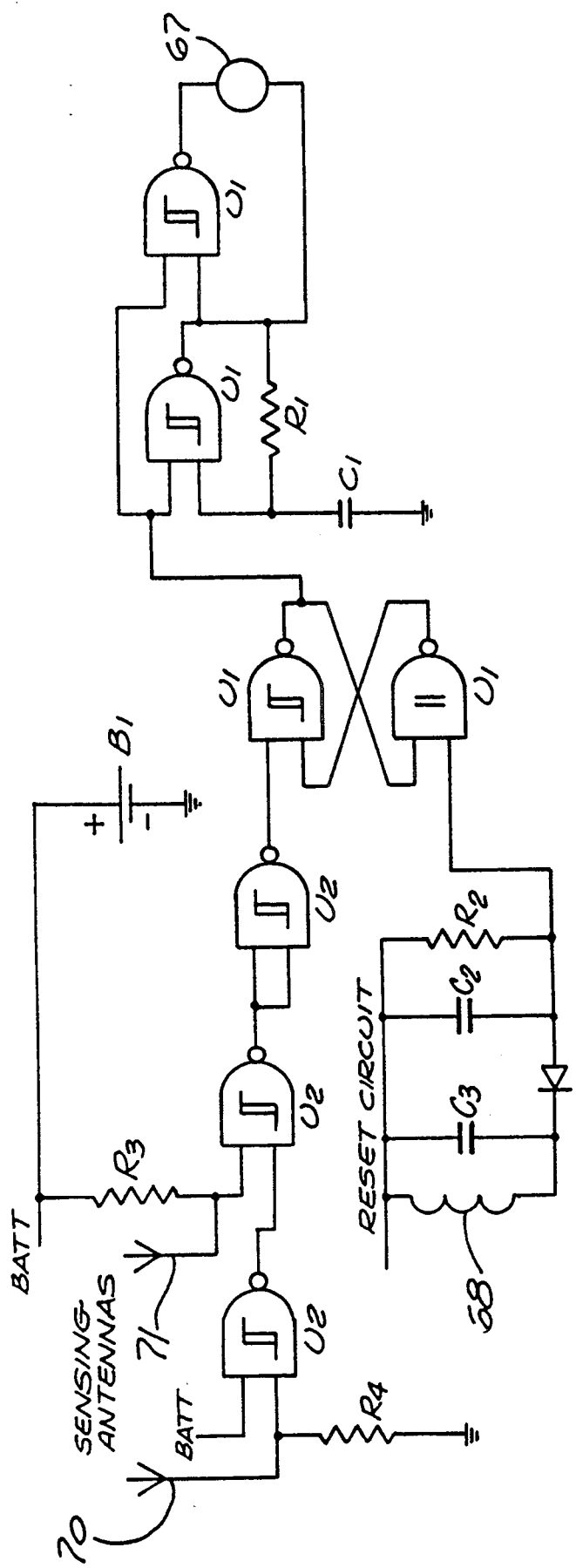
FIG. 12 is an electrical schematic for an embodiment of the detector.

A presently preferred electrical schematic suitable for a far proximity detector is shown in FIG. 12. Components for this circuit are set out in Table 1. The reset circuit is optional, and may be used for resetting the display element 67 after an ESD event has been detected and indicated. The reset circuit includes a tuned circuit formed by the coil 68 and the capacitor C3, and is actuated by positioning an electromagnetic source of suitable power and frequency adjacent the tuned circuit.

In the circuit illustrated in FIG. 12, two sensing antennas 70, 71 are utilized to provide for sensing of both positive going and negative going ESD pulses.

TABLE 1

| Reference | Description | Value |
| --- | --- | --- |
| C1 | Capacitor, 50 V | .01 uF |
| C2 | Capacitor, 50 V | .001 uF |
| C3 | Capacitor, 50 V | 47 pF |
| B1 | Battery | 3 V |
| D1 | Diode, high speed DL4148 | |
| R1, R2 | Resistor | 2.2M |
| R3, R4 | Resistor | 120M |
| U1, U2 | IC, quad schmitt NAND gate MC14093BD | |

We claim:

1. In a detector for detecting electrostatic discharge events in an electronic component or assembly device, the combination of:
a non-destructive direct reading display element which changes indication on exposure to a change in voltage level;
an electrostatic discharge sensor including amplifier means and antenna means; and
means for connecting an output of said amplifier means to said display element;
said antenna means including first and second antennae, and circuit means for connecting said first antenna and second antenna into said amplifier means for receiving electrostatic discharge events of different polarity.

2. A detector as defined in claim 1 wherein said display element is a liquid crystal display.

3. A detector as defined in claim 2 wherein said display element is a ferroelectric liquid crystal display.

4. A detector as defined in claim 2 including means for mounting said sensor and display element directly on the device to be monitored.

5. A detector as defined in claim 4 wherein said means for mounting includes a housing for said display element and sensor with clip means for attaching said housing to the device to be monitored.

6. A detector as defined in claim 4 wherein said means for mounting includes a base with said display element on one side and an adhesive layer on the opposite side.

7. A detector as defined in claim 1 for monitoring the body of a human assembler, with said sensor and display element in a package, and including means for attaching said package to said assembler.

8. A detector as defined in claim 1 including reset means for resetting said display element to its original state after said change of indication.

9. A detector as defined in claim 1 wherein said display element is a twisted nematic element.

10. A detector as defined in claim 1 wherein said display element is a smectic A element.

11. A detector as defined in claim 1 wherein said display element changes indication from a first state to a second state, and including means for maintaining said element in said second state thereby subsequently indicating the occurrence of an electrostatic discharge event.

* * * * *